(12) United States Patent
Park et al.

(10) Patent No.: US 10,818,213 B2
(45) Date of Patent: Oct. 27, 2020

(54) DISPLAY DEVICE FOR REDUCING AN ELECTROMAGNETIC INTERFERENCE

(71) Applicant: LG Display Co., Ltd., Seoul (KR)

(72) Inventors: Chansoo Park, Goyang-si (KR); HyungBeom Shin, Goyang-si (KR); SeEung Lee, Bucheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/534,334

(22) Filed: Aug. 7, 2019

(65) Prior Publication Data

US 2020/0066198 A1     Feb. 27, 2020

(30) Foreign Application Priority Data

Aug. 27, 2018   (KR) .................. 10-2018-0100303

(51) Int. Cl.
*G09G 5/00*     (2006.01)
*G09G 3/20*     (2006.01)
(Continued)

(52) U.S. Cl.
CPC ............. *G09G 3/20* (2013.01); *H01L 27/124* (2013.01); *G09G 3/2074* (2013.01); *G09G 3/3208* (2013.01); *G09G 3/344* (2013.01); *G09G 3/3607* (2013.01); *G09G 2310/0297* (2013.01); *G09G 2310/08* (2013.01); *G09G 2330/06* (2013.01); *H01L 23/62* (2013.01); *H01L 27/0288* (2013.01); *H01L 27/0292* (2013.01); *H01L 27/32* (2013.01)

(58) Field of Classification Search
CPC ...... G09G 3/20; G09G 3/2074; G09G 3/3208; G09G 3/344; G09G 3/3607; G09G 2310/0297; G09G 2330/06; G09G 2310/08; H01L 27/0292; H01L 27/124; H01L 27/32; H01L 27/0288; H01L 23/62
See application file for complete search history.

(56) References Cited

U.S. PATENT DOCUMENTS

2004/0119675 A1*  6/2004  Washio ............... G09G 3/3688
                                                              345/87
2009/0115690 A1*  5/2009  Chang ................... G09G 3/006
                                                              345/55

(Continued)

FOREIGN PATENT DOCUMENTS

CN          106652927 A    5/2017
KR    10-2006-0076147 A    7/2006
(Continued)

*Primary Examiner* — Adam J Snyder
(74) *Attorney, Agent, or Firm* — Seed IP Law Group LLP

(57) ABSTRACT

Provided is a display device. The display device includes a substrate including an active area in which a plurality of pixels is disposed and a non-active outside a periphery of the active area. A plurality of signal lines is disposed in parallel with one another and extend in a first direction in the non-active area. Each of the plurality of signal lines includes a first portion, a second portion, and a third portion which are sequentially connected to one another. The first and third portions extend in the first direction and are disposed in parallel with one another. Embodiments provided herein facilitate a reduction of electromagnetic interference between the display device and an external electronic device.

16 Claims, 6 Drawing Sheets

(51) Int. Cl.
*H01L 27/12* (2006.01)
*H01L 27/02* (2006.01)
*H01L 27/32* (2006.01)
*H01L 23/62* (2006.01)
*G09G 3/3208* (2016.01)
*G09G 3/34* (2006.01)
*G09G 3/36* (2006.01)

(56) References Cited

U.S. PATENT DOCUMENTS

| | | | |
|---|---|---|---|
| 2010/0245301 A1* | 9/2010 | Shang | G09G 3/3677 345/204 |
| 2012/0235983 A1* | 9/2012 | Sakamoto | G09G 3/3688 345/212 |
| 2012/0249499 A1* | 10/2012 | Takahashi | G09G 3/006 345/204 |
| 2014/0028535 A1* | 1/2014 | Min | G09G 3/18 345/87 |
| 2015/0255030 A1* | 9/2015 | Watsuda | G09G 3/3685 345/92 |
| 2017/0124972 A1* | 5/2017 | Kim | G09G 3/3648 |

FOREIGN PATENT DOCUMENTS

| | | |
|---|---|---|
| TW | 201143026 A | 12/2011 |
| TW | 201535691 A | 9/2015 |

* cited by examiner

DISPLAY DEVICE FOR REDUCING AN ELECTROMAGNETIC INTERFERENCE

CROSS-REFERENCE TO RELATED APPLICATION

This application claims the priority of Korean Patent Application No. 10-2018-0100303 filed on Aug. 27, 2018, in the Korean Intellectual Property Office, the disclosure of which is incorporated herein by reference.

BACKGROUND

Technical Field

The present disclosure relates to a display device, and more particularly, to a display device which is capable of reducing an electromagnetic interference (EMI) of the display device.

Description of the Related Art

As the information technology is developed, a market of a display device which is a connecting medium between users and information is growing. A display device is basically mounted in an electronic device such as a mobile phone, a tablet, a navigation, a notebook, a television, a monitor, and a public display (PD) so that demands for the display device is also increasing day by day.

The display device may include a wiring line which transmits various signals and a magnetic field may be generated inside or outside the display device by the signal applied to the wiring line. An electromagnetic wave may be generated in the display device due to the magnetic field and the electromagnetic interference may be generated between the display device and other electronic device adjacent to the display device.

When the electromagnetic interference is generated between the display device and other electronic device, a noise may be generated in a signal generated in the display device and other electronic device and the display device and the other electronic device may erroneously operate. Further, a signal quality of the display device and other electronic device may be degraded. Therefore, there is a necessity for reducing the electromagnetic interference by the magnetic field generated in the display device.

BRIEF SUMMARY

In various embodiments, the present disclosure provides a display device in which a plurality of signal lines extends in parallel in the same direction respectively and sub wiring lines connected to each other and connecting lines connecting ends of the sub wiring lines are included, thereby cancelling the magnetic field generated in each sub wiring line at the outside of the signal line to reduce the electromagnetic interference.

In some embodiments, the present disclosure provides a display device used for a vehicle which includes sub wiring lines and a connecting line connecting ends of the sub wiring lines, thereby reducing an erroneous operation and the performance degradation due to the electromagnetic interference of the display device and various other electronic devices disposed in the vehicle.

It should be noted that the contents of the present disclosure described in the problems, the solutions to the problems, and the effects described above do not specify essential features of the claims. Accordingly, the scope of the claims is not limited to what is described in the description of the present disclosure.

In order to achieve the above-described features, objects, or advantages, according to an embodiment of the present disclosure, a display device includes: a substrate including an active area in which a plurality of pixels is disposed and a non-active area outside a periphery of the active area; and a plurality of signal lines is disposed in parallel with one another and extending in a first direction in the non-active area, in which each of the plurality of signal lines includes a first portion, a second portion, and a third portion which are sequentially connected to one another, and the first portion and the third portion extend in the first direction and are disposed in parallel with one another. Therefore, the electromagnetic interference by the magnetic fields generated in the plurality of signal lines may be reduced.

According to another embodiment of the present disclosure, a display device includes: a substrate including an active area in which a plurality of pixels is disposed and a non-active area which at least partially surrounds the active area; and a plurality of signal lines disposed in the non-active area, the plurality of signal lines, in use, is applied with clock signals having different phases, in which each of the plurality of signal lines includes first and second sub wiring lines extending in a same direction and a connecting line which connects the first and second sub wiring lines. Therefore, the magnetic fields generated in the plurality of signal lines may be cancelled with each other.

Details of other embodiments will be included in the detailed description and the accompanying drawings.

According to the present disclosure, a magnetic field generated in the plurality of wiring lines included in the display device is cancelled at the outside of the plurality of signal lines so that the electromagnetic interference between the display device and the external electronic device may be reduced.

Further, when the display device is disposed in the vehicle, the magnetic field generated in the plurality of signal lines is cancelled at the outside of the display device so that the erroneous operation and a signal transmitting failure due to the electromagnetic interference between the display device and various other electronic devices disposed in the vehicle may be reduced.

The effects of the present disclosure are not limited to the effects mentioned above, and other effects not mentioned can be clearly understood by those skilled in the art from the following description.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
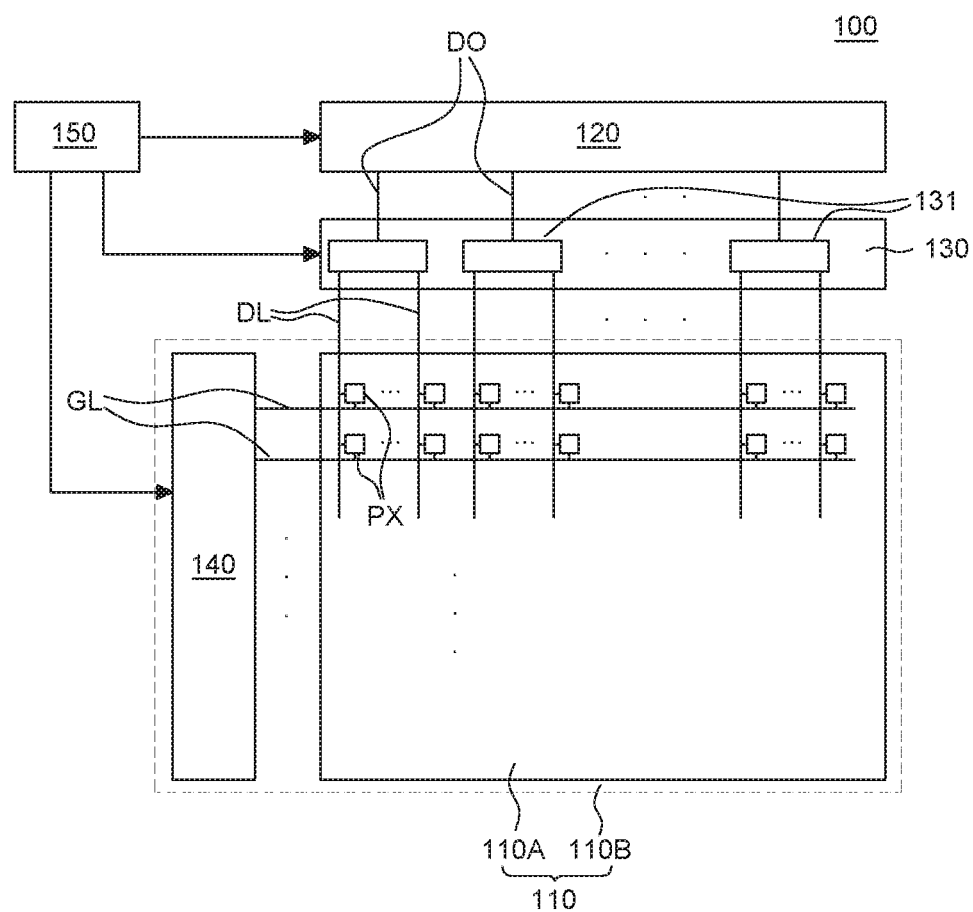
FIG. 1 is a schematic block diagram of a display device according to an exemplary embodiment of the present disclosure.

Advantages and characteristics of the present disclosure and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range (e.g., a tolerance range) even if not expressly stated.

When the position relation between two elements is described using the terms such as "on", "above", "below", and "next", one or more elements may be positioned between the two parts unless the terms are used with the term "immediately" or "directly".

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Each of the features of the various embodiments of the present disclosure can be combined or combined with each other partly or entirely. The features of the various embodiments can be technically interlocked and driven as well. The features of the various embodiments can be practiced independently or in conjunction with each other independently of each other.

Hereinafter, various embodiments of the present disclosure will be described in detail with reference to accompanying drawings.

FIG. 1 is a schematic block diagram of a display device according to an exemplary embodiment of the present disclosure. Referring to FIG. 1, a display device 100 includes a display panel 110, a timing controller 150, a data driver 120, a gate driver 140, and a demultiplexing unit 130.

The display panel 110 is a component which displays images. The display panel 110 may be implemented by a display panel used in various display devices such as a liquid crystal display device, an organic light emitting display device, or an electrophoretic display device.

The display panel 110 includes an active area 110A defined by a plurality of pixels PX (e.g., the plurality of pixels PX is disposed in the active area 110A) and a non-active area 110B in which various signal lines or pads are formed. In the active area 110A of the display panel 110, a plurality of pixels PX defined by a plurality of data lines DL and a plurality of gate lines GL is disposed. The plurality of pixels PX is components which generate light to display images. One pixel PX includes a transistor connected to the gate line GL and/or the data line DL and a pixel circuit which operates in response to a gate signal and a data signal supplied by the transistor. The pixel PX may be implemented by a liquid crystal display panel including a liquid crystal element or an organic light emitting display panel including an organic light emitting diode, depending on a configuration of the pixel circuit. The non-active area 110B is disposed outside a periphery or an outer boundary of the active area 110A, and in some embodiments, the non-active area 110B may surround the active area 110A.

In the active area 110A and the non-active area 110B of the display panel 110, a plurality of data lines DL and a plurality of gate lines GL which extend in different directions and intersect each other are disposed. The plurality of data lines DL is wiring lines which transmit a data signal to the plurality of pixels PX and the plurality of gate lines GL is wiring lines which transmit a gate signal to the plurality of pixels PX.

Referring to FIG. 1, the timing controller 150 of the display device 100 is a component which transmits a control signal to various components of the display device. The timing controller 150 receives timing signals such as a vertical synchronization signal, a horizontal synchronization signal, a data enable signal, or a dot clock through a receiving circuit such as an LVDS or TMDS interface connected to an image board. The timing controller 150 generates control signals to control an operating timing of the data driver 120, the gate driver 140, and the demultiplexing unit 130 based on the input timing signal.

Referring to FIG. 1, the data driver 120 is a component which generates a video signal selected as a data signal transmitted to the plurality of pixels PX, as an output signal. The data driver 120 includes a plurality of source drive ICs (integrated circuits). The plurality of source driver ICs is supplied with the video signal from the timing controller 150. The video signal refers to a signal which is selectively applied to the data line to be generated as a data signal. The data driver 120 may transmit the video signal to the demultiplexing unit 130 through an output line DO.

Referring to FIG. 1, the demultiplexing unit 130 is a component which selectively outputs the video signal as a data signal. The demultiplexing unit 130 includes a plurality of demultiplexers 131. The demultiplexer 131 is a component which receives the video signal from the data driver 120 to transmit the data signal to each of the plurality of data lines DL. The demultiplexer 131 may be applied with the timing control signal from the timing controller 150 and supplies the data signal through the data line DL of the display panel 110 in response to the timing control signal.

Referring to FIG. 1, the gate driver 140 is a component which generates a gate signal to be transmitted to the plurality of pixels PX. The gate driver 140 is supplied with a plurality of clock signals in which the level of the clock signal input as a transistor-transistor-logic (TTL) level is shifted from the timing controller 150. The gate driver 140 may include a shift register. The shift register may be formed in the form of a transistor, in the non-active area 110B of the display panel 110, by a GIP manner, but is not limited thereto. The shift register is configured by a plurality of stages which shifts the scan signal to output, in response to the clock signal and the driving signal. The plurality of stages included in the shift register sequentially outputs the gate signal to the plurality of gate lines GL through a plurality of output ends.

Hereinafter, the gate driver 140 of the display device according to an exemplary embodiment of the present disclosure will be described in more detail with reference to FIGS. 2 to 4.

Figure 2:
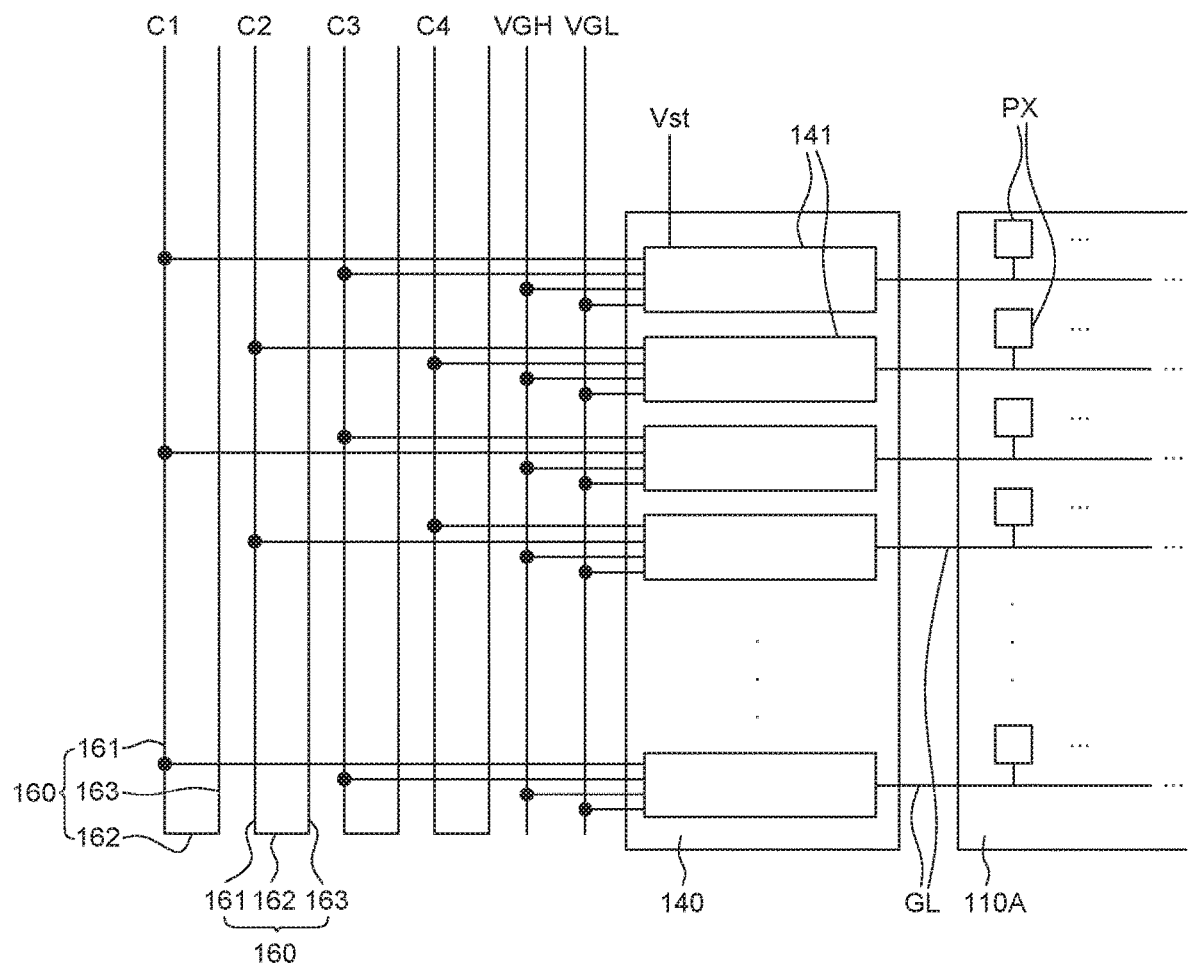
FIG. 2 is a schematic enlarged plan view of a display device according to an exemplary embodiment of the present disclosure.

FIG. 2 is a schematic enlarged plan view of a display device according to an exemplary embodiment of the present disclosure. FIG. 3 is a schematic enlarged plan view of a display device according to an exemplary embodiment of the present disclosure. FIG. 4 is a cross-sectional view taken along IV-IV' of FIG. 3; FIG. 2 is a plan view enlarging a gate driver 140 and an active area 110A of the display device 100 according to an exemplary embodiment of the present disclosure and other components are omitted. FIG. 3 is a plan view enlarging the plurality of signal lines 160 of FIG. 2. FIG. 4 illustrates only the substrate 111 and the plurality of signal lines 160 of the display device 100 according to an exemplary embodiment of the present disclosure of FIG. 1 and other components are omitted for the convenience of description.

Referring to FIG. 2, the shift register of the gate driver 140 includes a plurality of stages 141. The plurality of stages 141 is components which generate a gate signal and transmits the gate signal to the gate lines GL.

Specifically, the plurality of stages 141 may be applied with a high potential voltage VGH and a low potential voltage VGL. The output signal of the plurality of stages 141 is formed of a high potential voltage VGH and a low potential voltage VGL. When the plurality of stages 141 outputs a high potential voltage VGH, the gate line GL of the display panel 110 receives the high potential voltage VGH to cause the pixel PX to emit light. After the pixel PX emits light, the stage 141 connected to the pixel PX which emits light outputs the low potential voltage VGL so as to block the inflow of a data signal to be transmitted to a subsequent pixel PX.

Further, a first stage among the plurality of stages 141 may be applied with a start signal Vst and the plurality of stages 141 may sequentially generate a gate signal in accordance with the application of the start signal Vst. The plurality of stages 141 may be connected to the gate lines GL respectively and sequentially transmit the gate signal to the gate lines GL in accordance with the plurality of clock signal applied from the plurality of signal lines 160. Therefore, the plurality of stages 141 may transmit the gate signal to the plurality of pixels PX through the plurality of gate lines GL.

Figure 3:
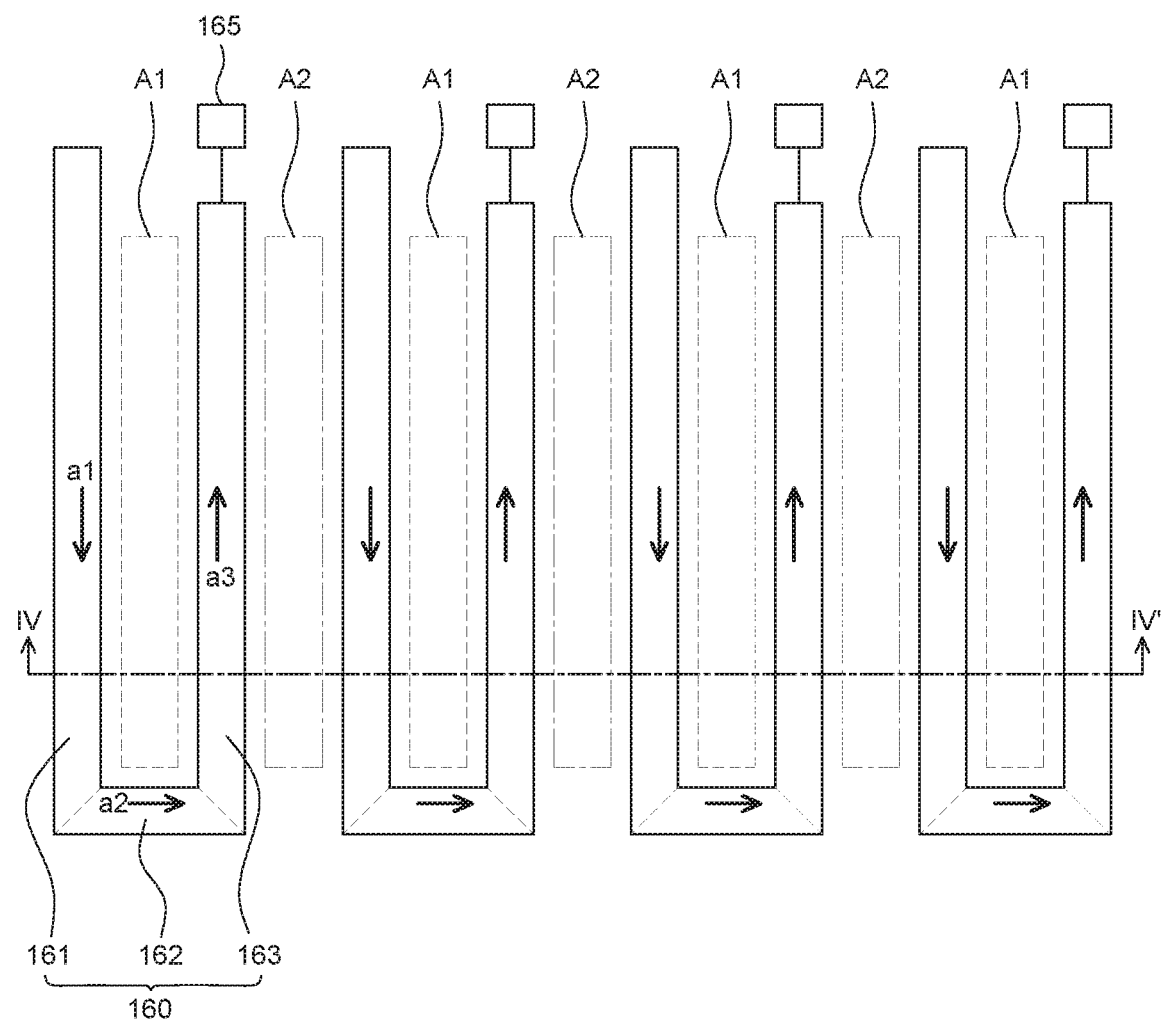
FIG. 3 is a schematic enlarged plan view of a display device according to an exemplary embodiment of the present disclosure.
Figure 4:
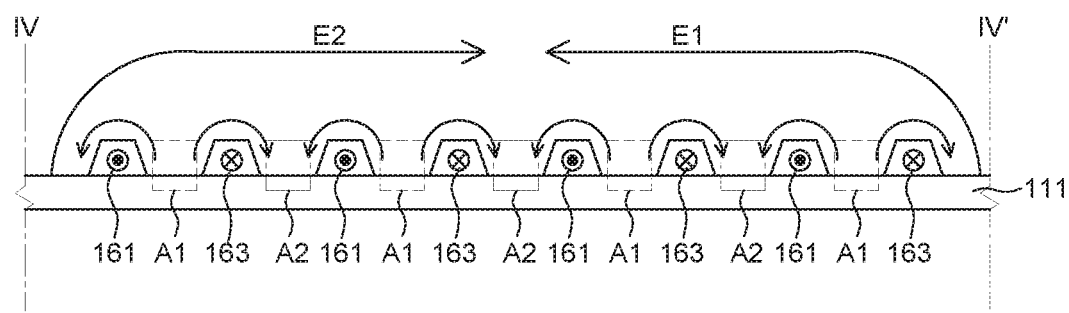
FIG. 4 is a cross-sectional view taken along IV-IV' of FIG. 3.

Referring to FIGS. 2 to 4, the plurality of signal lines 160 is disposed on the substrate 111. The plurality of signal lines 160 is wiring lines which transmit the plurality of clock signals to the gate driver 140.

Specifically, the plurality of signal lines 160 may be configured by four wiring lines, as illustrated in FIGS. 2 to 4. The signal lines 160 extend in the same direction to be disposed in parallel with one another. The number of the plurality of signal lines 160 is not limited to four, as illustrated in FIGS. 2 to 4, and may be two or larger.

Further, the plurality of signal lines 160 includes a first portion 161 (which may be referred to herein as a first part 161), a second portion 162 (which may be referred to herein as a second part 162), and a third portion 163 (which may be referred to herein as a third part 163) which are sequentially connected. In some embodiments, the first part 161, second part 162, and third part 163 may be portions of the same signal line 160 which are connected to one another, and in some embodiments, they may be integrally formed as a single part, e.g., as a single conductive trace having first, second, and third portions. The first part 161 is a part of the plurality of signal lines 160 one end of which is applied with a clock signal and the second part 162 is a part one end of which is connected to the other end of the first part 161 to which the clock signal is not applied. The third part 163 is a part which is connected to the other end of the second part 162 not connected to the first part 161. That is, the plurality of signal lines 160 includes the first part 161 one end of which is applied with the clock signal, the second part 162 one end of which is connected to the other end of the first part 161, and the third part 163 connected to the other end of the second part 162.

The first part 161 and the third part 163 of the plurality of signal lines 160 extend in an extending direction of the plurality of signal lines 160 to be disposed in parallel. That is, the first part 161 and the third part 163 may be sub wiring lines of the plurality of signal lines 160 which extend in the same direction to be disposed in parallel. For example, the plurality of signals lines 160 may be disposed in parallel with one another and may extend in a first direction (e.g., the vertical direction as shown in FIG. 2) in the non-active area. Moreover, the first part 161 and the third part 163 of each of the signal lines 160 may extend in the first direction and are disposed in parallel with one another. As shown in FIG. 2, the signal lines 160 may extend in a direction that is transverse or perpendicular in some embodiments to the direction at which the gate lines GL extend (e.g., in the horizontal direction as shown in FIG. 2). Further, the second part 162 of the plurality of signal lines 160 may be a connecting line which connects the first part 161 and the third part 163 which are sub wiring lines. As shown in FIG. 2, the second part 162 may extend in a direction that is transverse to the first direction, for example, the second part 162 may extend along a horizontal direction as shown in FIG. 2, while the first and third parts 161, 163 may extend along the vertical direction. In some embodiments, the second part 162 may extend in a direction that is perpendicular to the first direction.

Each of the plurality of signal lines 160 may have a partially opened loop shape. Specifically, each of the plurality of signal lines 160 may have a loop shape formed by one end of the first part 161 which is one of two sub wiring lines, the second part 162 which is a connecting line, and one end of the third part 163 which is the other one of two sub wiring lines. That is, the first part 161 extends in one direction from one end to which a clock signal is applied to the other end and the third part 163 is disposed in parallel to the first part 161 such that one end and the other end are adjacent to one end and the other end of the first part 161, respectively. Further, the second part 162 connects the other end of the first part 161 to which the clock signal is not applied and the other end of the third part 163 which is adjacent to the first part 161. Further, one end of the first part 161 to which the clock signal is applied and one end of the third part 163 which is not connected to the second part 162 are not connected to each other. Therefore, the first part 161, the second part 162, and the third part 163 may form an opened loop shape in which one end of the first part 161 and one end of the third part 163 are open. Therefore, the plurality of signal lines 160 may form a U shape, as illustrated in FIGS. 2 and 3. However, the present disclosure is not limited thereto and the second part 162 of each of the plurality of signal lines 160 may be formed to be curved and the plurality of signal lines 160 may have a U shape.

Further, the first part 161, the second part 162, and the third part 163 of the plurality of signal lines 160 may be formed of the same material and thus may be simultaneously formed by the same process.

Referring to FIGS. 2 to 4, the plurality of signal lines 160 may be applied with a plurality of clock signals. The plurality of clock signals may be pulse signals which are sequentially shifted. In the plurality of clock signals, phases are sequentially delayed in a predetermined interval of a high section (in which a logic level is a high state or a high voltage) and the high sections do not overlap. For example, a first clock signal C1, a second clock signal C2, a third clock signal C3, and a fourth clock signal C4 which are sequentially shifted pulse signals may be applied to four signal lines 160. Therefore, the plurality of clock signals may have four phases. However, the plurality of clock signals is not limited to the four phases, but the phases may vary depending on the number of the plurality of signal lines 160 and may have two phases or higher. Each of the stages 141 may be coupled to at least one of the plurality of signal lines 160. In some embodiments, each of the stages 141 may be coupled to two or more of the plurality of signal lines 160. For example, as shown in FIG. 2, each of the plurality of stages 141 may be coupled to two of the plurality of signal lines 160 (e.g., to receive the first clock signal C1 and the third clock signal C3, or to receive the second clock signal C2 and the fourth clock signal C4).

Referring to FIGS. 3 and 4, in the plurality of signal lines 160, a direction a1 of an electric current flowing in the first part 161 may be opposite to a direction a3 of an electric current flowing in the third part 163. Specifically, the clock signal may be applied to one end of the first part 161 of the plurality of signal lines 160. Therefore, the electric current flowing in the first part 161 may flow from one end of the first part 161 to the other end and flow from the other end of the first part 161 to the second part 162. Further, the electric current flowing into the second part 162 may flow from one end of the third part 163 which is connected to the second part 162 to the other end of the third part 163 which is not connected to the second part 162. Therefore, as illustrated in FIG. 3, the direction a1 of the electric current flowing in the first part 161 is a downward direction and the direction a3 of the electric current flowing in the third part 163 is an upward direction. Therefore, referring to the cross-sectional view of the plurality of signal lines 160 of FIG. 4, the direction of the electric current flowing in the first part 161 of the plurality of signal lines 160 is illustrated as a direction going out of the cross-sectional view and the direction of the electric current flowing in the third part 163 is illustrated as a direction entering the cross-sectional view.

Referring to FIGS. 3 and 4, when a plurality of clock signals is applied to the plurality of signal lines 160, in a first area A1 between the first part 161 and the third part 163 and a second area A2 between the plurality of signal lines 160, magnetic fields generated in the plurality of signal lines 160 may be constructively interfered.

Specifically, referring to FIG. 4, the electric current may flow in the first part 161 of the plurality of signal lines 160 in a direction going out of the cross-sectional view and a magnetic field may be generated around the first part 161 in a counterclockwise direction by the electric current flowing in the first part 161. In contrast, the electric current may flow in the third part 163 of the plurality of signal lines 160 in a direction entering the cross-sectional view and a magnetic field may be generated around the third part 163 in a clockwise direction by the electric current flowing in the third part 163.

Therefore, in an area between the first part 161 and the third part 163, that is, in the first area A1 which is an area between two sub wiring lines of the plurality of signal lines 160, the magnetic field by the electric current flowing in the first part 161 and the third part 163 may be constructively interfered in a direction toward a top surface of the substrate 111.

Further, in the second area A2 which is an area between the plurality of signal lines 160, the magnetic field by the electric current flowing in the first part 161 and the third part 163 may be constructively interfered in a direction entering a bottom surface of the substrate 111.

Further, in the outside of the plurality of signal lines 160, the magnetic field generated by the first part 161 of the plurality of signal lines 160 and the magnetic field generated by the third part 163 may be cancelled with each other. Specifically, at the outside of the plurality of signal lines 160, other than the second area A2 between the plurality of signal lines 160 and the first area A1 between the first part 161 and the third part 163 of the plurality of signal lines 160, the magnetic fields generated in the plurality of signal lines 160 may be cancelled. The magnetic field generated in the first part 161 among the plurality of signal lines 160 is a counterclockwise direction as described above and the sum of the magnetic fields generated in the first part 161 may correspond to a first magnetic field E1. Further, the magnetic field generated in the third part 163 among the plurality of signal lines 163 is a clockwise direction as described above and the sum of the magnetic fields generated in the third part 163 may correspond to a second magnetic field E2. In this case, the same electric current may flow in the first part 161 and the third part 163 of the plurality of signal lines 160 and thus intensities of the first magnetic field E1 and the second magnetic field E2 may be equal to each other. Therefore, the first magnetic field E1 and the second magnetic field E2 may be cancelled with each other at the outside of the plurality of signal lines 160 as illustrated in FIG. 4.

In the meantime, a static electricity suppresser 165 (which may be referred to herein as a static electricity suppressing unit) may be disposed at one end of the third part 163 of the plurality of signal lines 160. The static electricity suppressing unit 165 is a component which suppresses the static electricity from being generated in the plurality of signal lines 160, and in various embodiments, the static electricity suppressing unit 165 may be or include one or more electrostatic discharge structures or materials. Specifically, the second part 162 is connected to one end of the third part 163 of the plurality of signal lines 160 and the static electricity suppressing unit 165 may be disposed at the other end of the third part 163. In the display device 100 according to an exemplary embodiment of the present disclosure, the static electricity suppressing unit 165 is disposed at one end of the third part 163 among the plurality of signal lines 160 so that the static electricity is suppressed from being generated in the plurality of signal lines 160. Therefore, the erroneous operation and the failure of the display device 100 due to the static electricity may be reduced. Although only one static electricity suppressing unit 165 is illustrated in FIG. 3, it will be readily appreciated that additional static electricity suppressing units may be included in various embodiments.

In the case of the display device of the related art, the plurality of signal lines extends in one direction. That is, the plurality of signal lines of the display device of the related art is a single straight type, rather than a loop type. In this case, all the electric current flowing in the plurality of signal lines may flow in the same direction and the magnetic fields by the electric current flowing in the plurality of signal lines may be formed in the same direction while enclosing the signal lines therearound. Therefore, two magnetic fields formed around two signal lines which are adjacent are formed in opposite directions in the area between two signal lines and thus the magnetic field generated by the electric current flowing in the signal lines may be cancelled with each other in an area between two signal lines. However, when the magnetic field is measured at the outside of the plurality of signal lines, the directions of the magnetic fields generated by the current flowing in the plurality of signal lines may be the same and the magnetic fields may be constructively interfered. Therefore, the intensity of the magnetic field measured at the outside of the plurality of signal lines may be increased by the constructive interference. Therefore, in the display device of the related art, the intensity of the magnetic field generated by the plurality of signal lines is increased so that a noise of the display device is increased, which may result in the increase of the possibility of the erroneous operation. Further, the electromagnetic interference may be generated by the interference of the magnetic field generated in other electronic device disposed to be adjacent to the display device and the amplified magnetic field generated in the display device. Therefore, a signal transmission quality may be degraded or a failure may be generated in the display device and other electronic device.

In contrast, in the display device 100 according to an exemplary embodiment of the present disclosure, each of the plurality of signal lines 160 which transmits a plurality of clock signals to the plurality of stages 141 of the gate driver 140 includes a first part 161, a second part 162, and a third part 163 which are disposed to have a partially opened loop shape. The first part 161 and the third part 163 are disposed in parallel as sub wiring lines of the plurality of signal lines 160 and the direction of the electric current flowing in the first part 161 may be opposite to the direction of the electric current flowing in the third part 163. Therefore, the magnetic fields generated by the electric current flowing in the first part 161 and the third part 163 are constructively interfered in the first area A1 between the first part 161 and the third part 163 and the area A2 between the plurality of signal lines 160. However, when the magnetic fields are measured at the outside of the plurality of signal lines 160, the magnetic fields may be cancelled with each other. Therefore, when the magnetic fields are measured at the outside of the display device 100, the magnetic fields generated by the plurality of signal lines 160 are cancelled so that the intensity of the measured magnetic field may be reduced. Therefore, the electromagnetic interference between the display device 100 and other external electronic device may be reduced and the noise or the erroneous operation of the display device 100 or other external electronic device may be reduced.

Further, when the display device of the related art is used for a vehicle, the electromagnetic interference with various electronic devices disposed in the vehicle may be increased. Specifically, in order to improve convenience of the user who uses the vehicle, various electronic devices including the display device may be disposed in the vehicle. The display device and various electronic devices disposed in the vehicle may be closely disposed in a relatively narrow space and thus the possibility of the erroneous operation or a signal transmission error may be increased due to the electromagnetic interference between the display device and various other electronic devices. Specifically, when the display device is disposed in the vehicle, the electromagnetic interference generated by the plurality of signal lines disposed in the display device may become a more serious problem.

In contrast, when the display device 100 according to an exemplary embodiment of the present disclosure is used in the vehicle, the electromagnetic interference with various electronic devices disposed in the vehicle may be effectively reduced. Specifically, the plurality of signal lines 160 may include the first part 161 and the third part 163 in which electric current flows in different directions, respectively, so that the intensity of the magnetic field measured at the outside of the display device 100 may be reduced. Therefore, the electromagnetic interference between the display device 100 according to the exemplary embodiment of the present disclosure installed in the vehicle and other electronic devices may be reduced and the erroneous operation and the performance degradation of various electronic devices in the vehicle may be effectively suppressed. Accordingly, the occurrence of safety accidents due to the electromagnetic interference of the vehicle may be reduced.

Figure 5:
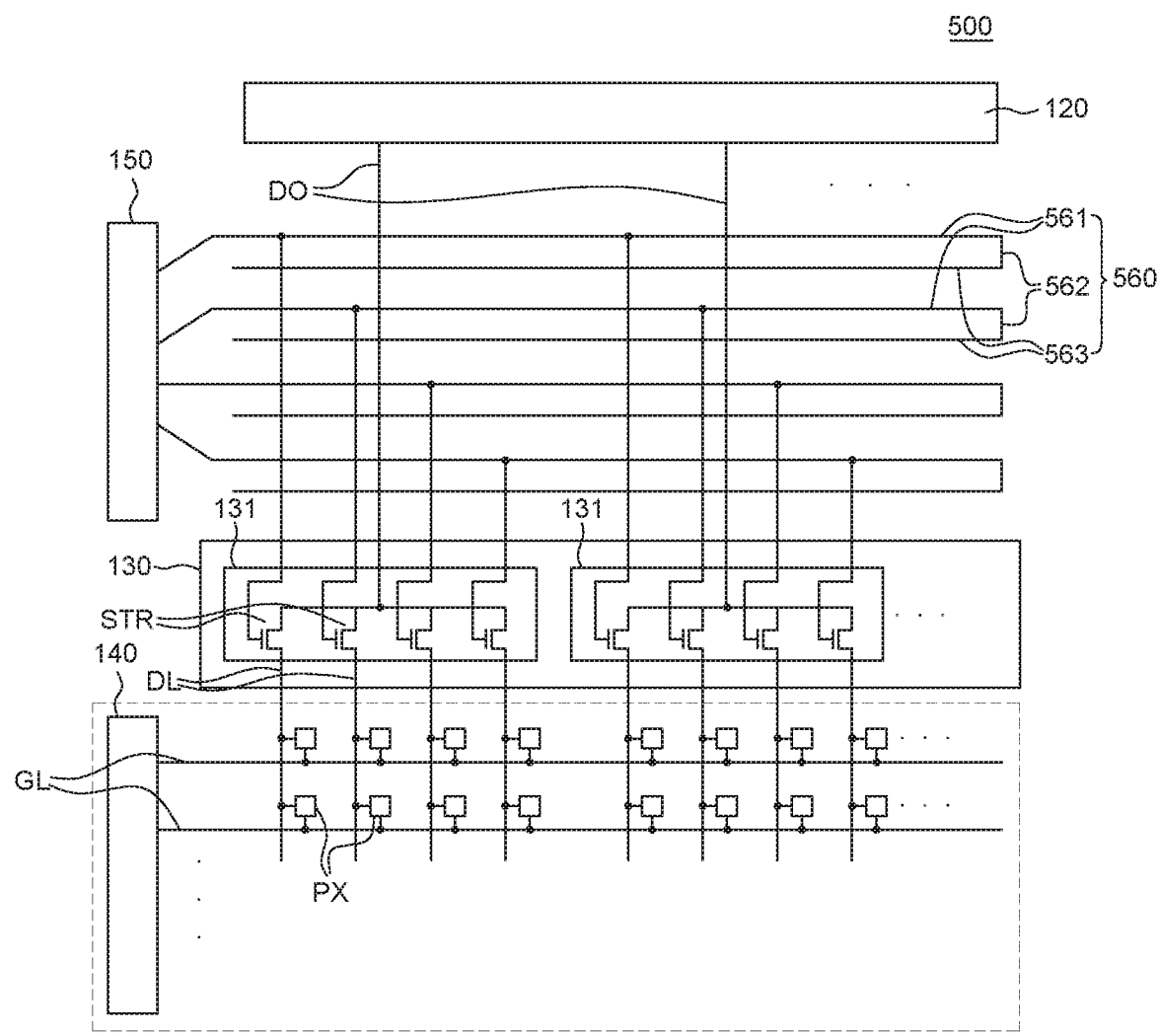
FIG. 5 is a schematic block diagram of a display device according to another exemplary embodiment of the present disclosure.

FIG. 5 is a schematic block diagram of a display device according to another exemplary embodiment of the present disclosure. A display device 500 of FIG. 5 is substantially the same as the display device 100 of FIGS. 1 to 4 except for a plurality of signal lines 560 so that a redundant description will be omitted.

Referring to FIG. 5, a plurality of signal lines 560 is disposed in a non-active area 110B. The plurality of signal lines 560 is wiring lines which transmit a plurality of clock signals to the demultiplexing unit 130.

Specifically, the plurality of signal lines 560 may be configured by four wiring lines, as illustrated in FIG. 5. The signal lines 560 extend in the same direction to be disposed in parallel. As shown in FIG. 5, the signal lines 560 may extend in a direction that is parallel with the direction at which the gate lines GL extend (e.g., in the horizontal direction as shown in FIG. 5), and the signal lines 560 may extend in a direction that is transverse, or perpendicular in some embodiments, to the direction at which the data lines DL extend. The number of the plurality of signal lines 560 is not limited to four as illustrated in FIG. 5 and may be two or larger.

Further, the plurality of signal lines 560 includes a first part 561, a second part 562, and a third part 563 which are sequentially connected. The first part 561 is a part of the plurality of signal lines 560 which is applied with a clock signal and the second part 562 is a part connected to the other end, excluding one end of the first part 561 to which the clock signal is applied. Further, the third part 563 is a part which is connected to the other end, excluding one end of the second part 562 which is connected to the first part 561. That is, the plurality of signal lines 560 includes the first part 561 applied with the clock signal, the second part 562 which is connected to the other end of the first part 561, and the third part 563 which is connected to the other end of the second part 562.

The first part 561 and the third part 563 of the plurality of signal lines 560 extend in an extending direction of the plurality of signal lines 560 to be disposed in parallel. That is, the first part 561 and the third part 563 may be sub wiring lines of the plurality of signal lines 560 which extend in the same direction to be disposed in parallel. Further, the second part 562 of the plurality of signal lines 560 may be a connecting line which connects the first part 561 and the third part 563 which are sub wiring lines.

Each of the plurality of signal lines 560 may have a partially opened loop shape. Specifically, each of the plurality of signal lines 560 may have a loop shape formed by one end of the first part 561 which is one of two sub wiring lines, the second part 562 which is a connecting line, and one end of the third part 563 which is the other one of two sub wiring lines. Therefore, the first part 561, the second part 562, and the third part 563 form a curve line and one end of the first part 561 to which the clock signal is applied and one end of the third part 563 which is not connected to the second part 562 are not connected to each other. Therefore, the first part 561, the second part 562, and the third part 563 are open at one end of the first part 561 and one end of the third part 563 and form an open loop shape and the plurality of signal lines 560 may form a U shape, as illustrated in FIGS. 2 and 3. However, the present disclosure is not limited thereto and the second part 562 of each of the plurality of signal lines 560 may be formed to be curved and the plurality of signal lines 560 may have a U shape.

Further, the first part 561, the second part 562, and the third part 563 of the plurality of signal lines 560 may be formed of the same material and thus may be simultaneously formed by the same process.

Referring to FIG. 5, the plurality of signal lines 560 may be applied with a plurality of clock signals. The plurality of clock signals may be pulse signals which are sequentially shifted. In the plurality of clock signals, phases are sequentially delayed at a predetermined interval of a high section and the high sections do not overlap. For example, a first clock signal C1, a second clock signal C2, a third clock signal C3, and a fourth clock signal C4 which are sequentially shifted pulse signals may be applied to four signal lines 560. Therefore, the plurality of clock signals may have four phases. However, the plurality of clock signals is not limited to the four phases, but the phases may vary depending on the number of the plurality of signal lines 560 and may have two phases or higher.

Referring to FIG. 5, in the plurality of signal lines 560, a direction of an electric current flowing in the first part 561 may be opposite to a direction of an electric current flowing in the third part 563. Specifically, the clock signal may be applied to one end of the first part 561 of the plurality of signal lines 560. The electric current flowing in the first part 561 may flow from one end of the first part 561 to the other end and flow from the other end of the first part 561 to the second part 562. Further, the electric current flowing into the second part 562 may flow from one end of the third part 563 which is connected to the second part 562 to the other end of the third part 563 which is not connected to the second part 562. Therefore, the direction of the electric current flowing in the first part 561 is a right direction and the direction of the electric current flowing in the third part 563 is a left direction.

Further, when a plurality of clock signals is applied to the plurality of signal lines 560, in a first area between the first part 561 and the third part 563 and a second area between the plurality of signal lines 560, magnetic fields generated in the plurality of signal lines 560 may be constructively interfered. Since the directions of the electric current flowing in the first part 561 and the third part 563 are opposite, the magnetic fields by the electric current flowing in the first part 561 and the third part 563 respectively may be constructively interfered in the area between the first part 561 and the third part 563. Further, the magnetic fields by the electric current flowing in the first part 561 and the third part 563 may be constructively interfered in the area between the plurality of signal lines 560.

Further, the magnetic field generated by the first part 561 of the plurality of signal lines 560 and the magnetic field generated by the third part 563 may be cancelled with each other at the outside of the plurality of signal lines 560. Since the magnetic field generated by the electric current flowing in the first part 561 of the plurality of signal lines 560 and the magnetic field generated by the electric current flowing in the second part 562 of the plurality of signal lines 560 are formed in opposite directions at the outside of the plurality of signal lines 560 to be cancelled with each other.

Referring to FIG. 5, a plurality of demultiplexers 131 included in the demultiplexing unit 130 includes a plurality of sampling transistors STR. The plurality of sampling transistors STR is components which transmit a data signal to the plurality of data lines DL by a clock signal which is applied to the plurality of signal lines 560. As illustrated in FIG. 5, the demultiplexer 131 may include four sampling transistors STR, but is not limited thereto. For example, when a clock signal transmitted by the plurality of signal lines 560 has three phases, the demultiplexer may include three sampling transistors STR.

Further, all source electrodes of the plurality of sampling transistors STR included in one demultiplexer 131 may be connected to one output line DO of the data driver 120. Therefore, the same video signal may be transmitted from the output line DO of the data driver to the source electrodes of the plurality of sampling transistors STR.

Further, gate electrodes of the plurality of sampling transistors STR included in one demultiplexer 131 may be connected to the plurality of signal lines 560. Specifically, the plurality of sampling transistors STR may be sequentially connected to the plurality of signal lines 560 and the timing controller 150 may apply a timing control signal which is a clock signal to the plurality of signal lines 560. Therefore, the plurality of sampling transistors STR is applied with a timing control signal from the plurality of signal lines 560 to be selectively turned on.

Further, drain electrodes of the plurality of sampling transistors STR may be connected to the plurality of data lines DL. Therefore, the plurality of sampling transistors STR may transmit a data signal to the plurality of data lines DL by a timing control signal which is transmitted from the plurality of signal lines 560. Therefore, the data signal may be transmitted to the plurality of pixels PX through the plurality of data lines DL.

As described above, in the case of the display device of the related art, the plurality of signal lines extends in one direction. In this case, all the electric current flowing in the plurality of signal lines may flow in the same direction and the magnetic fields by the electric current flowing in the plurality of signal lines may be formed in the same direction while enclosing the signal lines therearound. Therefore, when the magnetic field is measured at the outside of the plurality of signal lines, the directions of the magnetic fields generated by the current flowing in the plurality of signal lines may be the same and the magnetic fields may be constructively interfered. Therefore, the intensity of the magnetic field measured at the outside of the plurality of signal lines may be increased by the constructive interference. Therefore, the noise of the display device of the related art is increased so that the possibility of erroneous operation may be increased. Further, the electromagnetic interference is generated by the magnetic field generated in other electronic device disposed to be adjacent to the display device and the amplified magnetic field generated in the display device. As a result, the signal transmission quality of the display device and the other electronic device may be degraded or the failure may be generated.

In contrast, in the display device 500 according to another exemplary embodiment of the present disclosure, each of the plurality of signal lines 560 which transmits a timing control signal to the demultiplexing unit 130 includes a first part 561, a second part 562, and a third part 563 which are disposed to have a partially opened loop shape. The first part 561 and the third part 563 are disposed in parallel as sub wiring lines of the plurality of signal lines 560 and the direction of the electric current flowing in the first part 561 may be opposite to the direction of the electric current flowing in the third part 563. Therefore, the magnetic fields generated by the electric current flowing in the first part 561 and the third part 563 are constructively interfered in the first area between the first part 561 and the third part 563 and the area between the plurality of signal lines 560. However, when the magnetic fields are measured at the outside of the plurality of signal lines 560, the magnetic fields may be cancelled with each other. Therefore, when the magnetic fields are measured at the outside of the display device 500, the magnetic fields generated by the plurality of signal lines 560 are cancelled so that the intensity of the measured magnetic field may be reduced. Therefore, the electromagnetic interference between the display device 500 and other external electronic device may be reduced and the noise or the erroneous operation of the display device 500 or other external electronic device may be reduced.

Further, when the display device 500 according to the exemplary embodiment of the present disclosure is used in the vehicle, the plurality of signal lines 560 may include the first part 561 and the third part 163 in which electric current flows in different directions. Therefore, the intensity of the magnetic field measured at the outside of the display device 500 may be reduced. Therefore, the electromagnetic interference between the display device 500 according to another exemplary embodiment of the present disclosure installed in the vehicle and other electronic devices may be reduced and the erroneous operation and the performance degradation of various electronic devices in the vehicle may be effectively suppressed. Accordingly, the occurrence of safety accidents due to the electromagnetic interference of the vehicle may be reduced.

Figure 6:
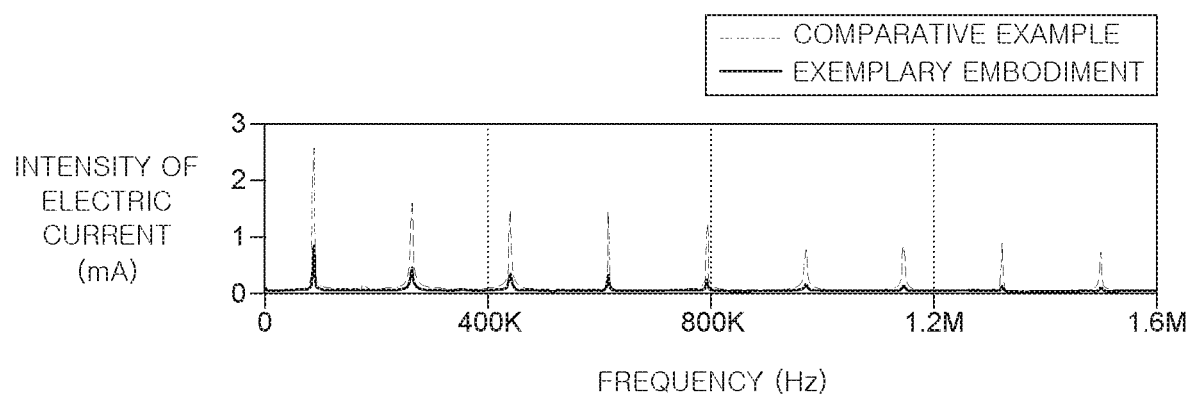
FIG. 6 is a graph for explaining an intensity of an electric current in accordance with a frequency of a display device according to a comparative example and an exemplary embodiment of the present disclosure.

FIG. 6 is a graph for explaining an intensity of an electric current in accordance with a frequency of a display device according to a comparative example and an exemplary embodiment of the present disclosure.

FIG. 6 illustrates an intensity of an electric current in accordance with a frequency in a frequency domain of the plurality of signal lines 160 of a display device according to a comparative example including a plurality of signal lines which includes only a first part among the first part, a second part, and a third part and a display device 100 according to an exemplary embodiment of the present disclosure including a plurality of signal lines 160 which includes all the first part 161, the second part 162, and the third part 163. The display device according to the comparative example and the display device 100 according to the exemplary embodiment have the same configuration except for the shape of the plurality of signal lines. Specifically, both the display device according to the comparative example and the display device 100 according to the exemplary embodiment are operated at a reference operation frequency of 60 Hz.

Referring to FIG. 6, it is confirmed that as compared with the display device of the comparative example in which the plurality of signal lines which does not include the second part and the third part, but includes only the first part is disposed, in the display device 160 of the exemplary embodiment in which the plurality of signal lines including all the first part 161, the second part 162, and the third part 163 is disposed, the intensity of the electric current at each frequency in the frequency domain is reduced. Therefore, as compared with the display device of the comparative example, in the display device 100 of the exemplary embodiment, the plurality of signal lines 160 has a partially opened loop shape so that the intensity of the magnetic field measured at the outside of the plurality of signal lines 160 is reduced, which may result in reduction of the electromagnetic interference.

The exemplary embodiments of the present disclosure can also be described as follows:

According to an aspect of the present disclosure, there is provided a display device. The display device may include a substrate including an active area in which a plurality of pixels may be defined and a non-active area which encloses the active area; and a plurality of signal lines which is disposed in parallel in the non-active area. Also, each of the plurality of signal lines may include a first part, a second part, and a third part which are sequentially connected and the first part and the third part extend in an extending direction of the plurality of signal lines to be disposed in parallel.

According to the other features of the present disclosure, pulse signals which may be sequentially shifted are applied to the plurality of signal lines.

According to another features of the present disclosure, a direction of an electric current flowing in the first part may be opposite to a direction of an electric current flowing in the third part.

According to another features of the present disclosure, the display device further may include a plurality of stages which is disposed in the non-active area and is connected to the plurality of signal lines, respectively; and a plurality of gate lines which is connected to the plurality of stages to transmit a gate signal to the plurality of pixels.

According to another features of the present disclosure, the display device further may include a demultiplexer which is disposed in the non-active area and is connected to the plurality of signal lines; and a plurality of data lines which is connected to the demultiplexer to transmit a data signal to the plurality of pixels.

According to another features of the present disclosure, the demultiplexer may include a plurality of transistors in which the plurality of signal lines is connected to gate electrodes and the plurality of transistors transmits the data signal to the plurality of data lines by a pulse signal which is applied to the plurality of signal lines.

According to other aspect of the present disclosure, there is provided a display device. The display device may include a substrate including an active area in which a plurality of pixels is defined and a non-active area which encloses the active area; and a plurality of signal lines which is disposed in the non-active area and is applied with clock signals having different phases. Also, the plurality of signal lines may include two sub wiring lines extending in the same direction and a connecting line which connects two sub wiring lines.

According to the other features of the present disclosure, the clock signal may be applied to one end of one sub wiring line between two sub wiring lines and a static electricity suppressing unit is connected to one end of the other sub wiring line, and the connecting line connects the other end of one sub wiring line and the other end of the other sub wiring line.

According to another features of the present disclosure, the plurality of signal lines may be disposed to have a loop shape formed by one end of one sub wiring line between two sub wiring lines, the connecting line, and one end of the other sub wiring line between two sub wiring lines.

According to another features of the present disclosure, each of the plurality of signal lines has a partially opened loop shape.

According to another features of the present disclosure, each of the plurality of signal lines may have a "U" shape.

According to another features of the present disclosure, when a signal may be applied to the plurality of signal lines, magnetic fields generated in the plurality of signal lines are constructively interfered in an area between two sub wiring lines and in an area between the plurality of signal lines.

According to another features of the present disclosure, the display device further may include a gate driver which is disposed in the non-active area on the substrate, wherein the plurality of signal lines is configured to apply a clock signal to the gate driver.

According to another features of the present disclosure, the display device further may include a demultiplexer which is disposed in the non-active area on the substrate and includes a plurality of transistors. Also, the plurality of signal lines may be configured to be connected to the plurality of transistors respectively to apply a selection signal for the plurality of transistors.

Although the embodiments of the present disclosure have been described in detail with reference to the accompanying drawings, it is to be understood that the present disclosure is not limited to those embodiments and various changes and modifications may be made without departing from the scope of the present disclosure. Therefore, the embodiments disclosed in the present disclosure are intended to illustrate rather than limit the scope of the present disclosure, and the scope of the technical idea of the present disclosure is not limited by these embodiments. Therefore, it should be understood that the above-described embodiments are illustrative in all aspects and not restrictive. The scope of the present disclosure should be construed according to the claims, and all technical ideas within the scope of equivalents should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
   a substrate including an active area in which a plurality of pixels is disposed and a non-active area outside a periphery of the active area; and
   a plurality of signal lines disposed in parallel with one another and extending in a first direction in the non-active area,
   wherein each of the plurality of signal lines includes a first portion, a second portion, and a third portion which are sequentially connected to one another, and the first portion and the third portion extend in the first direction and are disposed in parallel with one another,
   when pulse signals are applied to the plurality of signal lines, magnetic fields generated in the plurality of signal lines are constructively interfered in an area between the first portion and the third portion and in an area between the plurality of signal lines,
   when pulse signals are applied to the plurality of signal lines, magnetic field generated in the plurality of signal lines are cancelled with each other at the outside of the plurality of signal lines.

2. The display device according to claim 1, wherein, in use, pulse signals which are sequentially shifted are applied to the plurality of signal lines.

3. The display device according to claim 1, wherein a direction of an electric current flowing in the first portion is opposite to a direction of an electric current flowing in the third portion.

4. The display device according to claim 1, further comprising:
   a plurality of stages disposed in the non-active area, each of the plurality of stages electrically connected to at least one of the plurality of signal lines; and
   a plurality of gate lines respectively electrically connected to the plurality of stages, the plurality of gate lines configured to transmit respective gate signals to the plurality of pixels.

5. The display device according to claim 4, wherein the gate lines extend in a direction that is different from the first direction in the active area.

6. The display device according to claim 4, wherein the second portions of the plurality of signal lines extend in a second direction that is perpendicular to the first direction.

7. The display device according to claim 4, wherein the gate lines extend in the active area in a second direction that is transverse to the first direction.

8. The display device according to claim 1, further comprising:
   a demultiplexer disposed in the non-active area and electrically connected to the plurality of signal lines; and
   a plurality of data lines electrically connected to the demultiplexer, the plurality of data lines configured to transmit data signals to the plurality of pixels.

9. The display device according to claim 8, wherein the demultiplexer includes a plurality of transistors, each of the plurality of transistors having a gate electrode respectively electrically connected to one of the plurality of signal lines, the plurality of transistors configured to transmit the data signals to the plurality of data lines in response to pulse signals applied to the plurality of signal lines.

10. A display device, comprising:
    a substrate including an active area in which a plurality of pixels is disposed and a non-active area at least partially surrounding the active area; and
    a plurality of signal lines disposed in the non-active area, the plurality of signal lines, in use, is applied with clock signals having different phases,
    wherein each of the plurality of signal lines includes first and second sub wiring lines extending in a same direction and a connecting line which connects the first and second sub wiring lines,
    when the clock signals are applied to the plurality of signal lines, magnetic fields generated in the plurality of signal lines are constructively interfered in an area between the first and second sub wiring lines and in an area between the plurality of signal lines,
    when the clock signals are applied to the plurality of signal lines, magnetic fields generated in the plurality of signal lines are cancelled with each other at the outside of the plurality of signal lines.

11. The display device according to claim 10, wherein the clock signal is applied to a first end of the first sub wiring line and a static electricity suppresser is connected to a first end of the second sub wiring line, and the connecting line connects a second end of the first sub wiring line to a second end of the second sub wiring line.

12. The display device according to claim 10, wherein the plurality of signal lines is disposed to have a loop shape formed by one end of the first sub wiring line, the connecting line, and one end of the second sub wiring line.

13. The display device according to claim 10, wherein each of the plurality of signal lines has a partially opened loop shape.

14. The display device according to claim 13, wherein each of the plurality of signal lines has a "U" shape.

15. The display device according to claim 10, further comprising:
 a gate driver disposed in the non-active area on the substrate,
 wherein the plurality of signal lines is configured to apply the clock signals to the gate driver.

16. The display device according to claim 10, further comprising:
 a demultiplexer disposed in the non-active area on the substrate, the demultiplexer including a plurality of transistors,
 wherein the plurality of signal lines is connected to the plurality of transistors and configured to apply a selection signal to the plurality of transistors.

* * * * *